(12) United States Patent
Trivedi et al.

(10) Patent No.: US 6,806,134 B2
(45) Date of Patent: Oct. 19, 2004

(54) SIDEWALL STRAP FOR COMPLEMENTARY SEMICONDUCTOR STRUCTURES AND METHOD OF MAKING SAME

(75) Inventors: Jigish D. Trivedi, Boise, ID (US); Todd R. Abbott, Boise, ID (US); Zhongze Wang, Boise, ID (US)

(73) Assignee: Micron Techonlogy, Inc., Boise, ID (US)

( * ) Notice: Subject to any disclaimer, the term of this patent is extended or adjusted under 35 U.S.C. 154(b) by 0 days.

(21) Appl. No.: 10/205,131

(22) Filed: Jul. 24, 2002

(65) Prior Publication Data

US 2003/0054614 A1 Mar. 20, 2003

Related U.S. Application Data

(62) Division of application No. 09/945,337, filed on Aug. 31, 2001.

(51) Int. Cl.[7] .......................................... H01L 21/8238
(52) U.S. Cl. ...................... 438/233; 438/199; 438/230; 438/596
(58) Field of Search ................................. 438/289, 199, 438/229, 230, 231, 596, 232, 233

(56) References Cited

U.S. PATENT DOCUMENTS

| 4,716,131 | A | * | 12/1987 | Okazawa et al. | ............ | 438/586 |
| 5,087,582 | A | * | 2/1992 | Campbell et al. | ............ | 438/231 |
| 5,217,913 | A | | 6/1993 | Watabe et al. | .............. | 438/304 |
| 5,382,532 | A | * | 1/1995 | Kobayashi et al. | ......... | 438/199 |
| 5,464,789 | A | * | 11/1995 | Saito | ........................... | 438/289 |
| 5,956,617 | A | * | 9/1999 | Kimura et al. | .............. | 438/299 |
| 6,133,082 | A | * | 10/2000 | Masuoka | .................... | 438/199 |
| 6,583,518 | B2 | | 6/2003 | Trivedi et al. | .............. | 257/903 |
| 2002/0188631 | A1 | | 12/2002 | Tiemann et al. | ............ | 707/513 |

* cited by examiner

Primary Examiner—Michael Trinh
(74) Attorney, Agent, or Firm—Dorsey & Whitney LLP

(57) ABSTRACT

Devices, structures, and methods for enhancing devices using dual-doped polycrystalline silicon are discussed. One aspect of the present invention includes a p-type strip having a top, a bottom, two sides, and two ends; an n-type strip having a top, a bottom, two sides, and two ends; and a conductive inhibitor strip that adjoins a portion of one of the two sides of the p-type strip and a portion of one of the two sides of the n-type strip so as to inhibit cross-diffusion between the p-type strip and the n-type strip while electrical connection between n-type and p-type polycrystalline silicon is maintained.

23 Claims, 10 Drawing Sheets

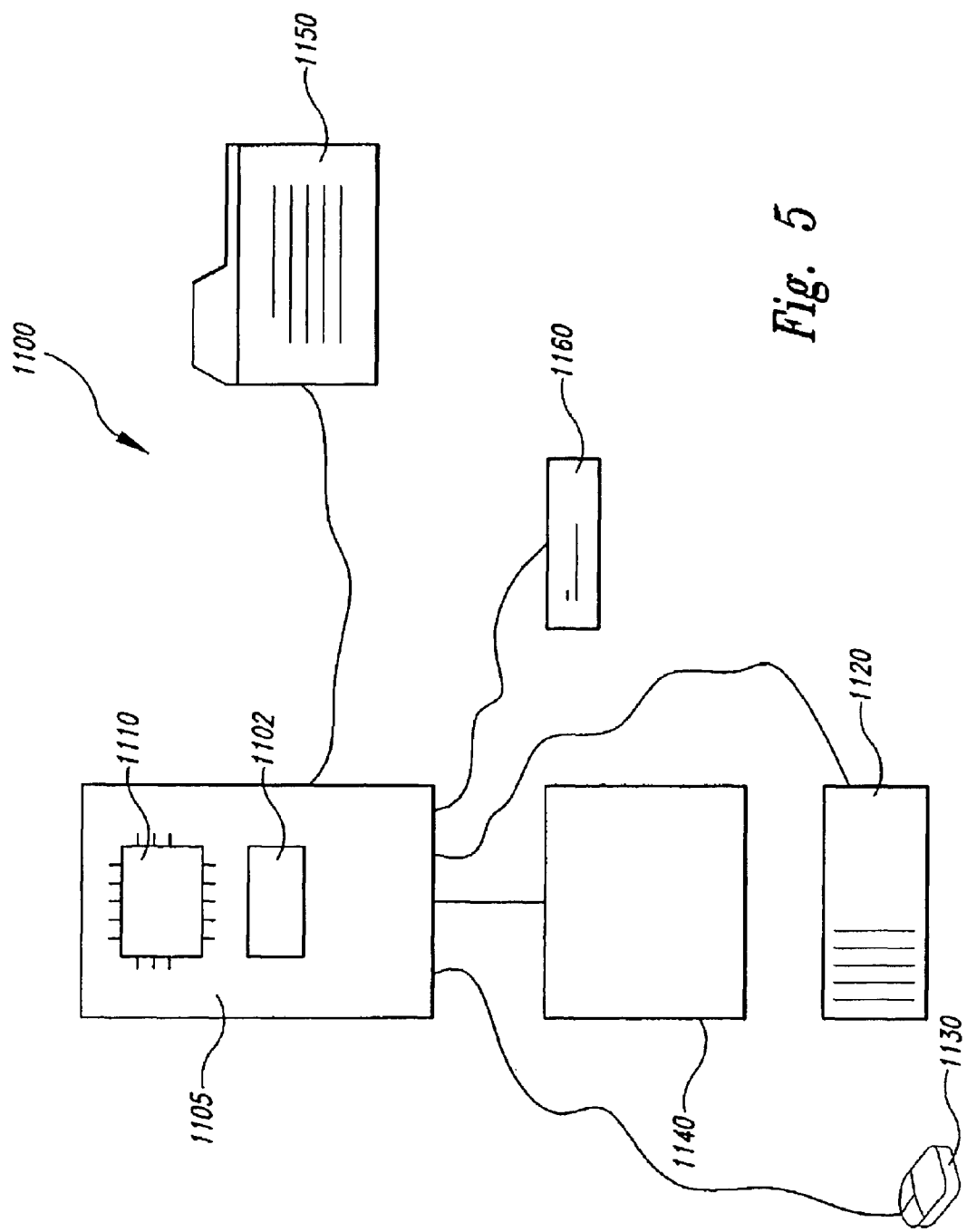

SIDEWALL STRAP FOR COMPLEMENTARY SEMICONDUCTOR STRUCTURES AND METHOD OF MAKING SAME

CROSS-REFERENCE TO RELATED APPLICATION

This application is a divisional of pending U.S. patent application Ser. No. 09/945,337, filed Aug. 31, 2001.

TECHNICAL FIELD

The invention relates generally to semiconductor devices. More particularly, it pertains to enhancing devices that are made from diverse polycrystalline substances so as to inhibit undesired cross diffusion and provide a gate electrode connection.

BACKGROUND OF THE INVENTION

A semiconductor has a conductivity that can be increased by introducing impurities into the semiconductor. Impurities that add more holes to a semiconductor are called acceptors. A semiconductor with an abundance of holes is called a p-type semiconductor. Impurities that add more electrons are called donors. A semiconductor with an abundance of electrons is called an n-type semiconductor.

One useful electronic device is the diode. The diode is made by forming a p-type semiconductor material adjacent to an n-type semiconductor material. Holes reside in abundance in the p-type semiconductor material but not in the n-type semiconductor material. Electrons reside in abundance in the n-type material but not in the p-type material. This situation creates a discontinuity in the concentration of holes and electrons and allows holes and electrons to diffuse. A metallurgical bond between the p-type and n-type regions forms a depletion region with an electromagnetic field of a magnitude that inhibits the further diffusion of electrons and holes. This effect can be overcome when desired to allow the diode to act as an electronic switch from which other electronic devices can be built.

Modern semiconductor processes may require a p-type semiconductor material to be adjoined to an n-type semiconductor material, but not for the purpose of forming a diode. Such a situation occurs in CMOS inverters where a n-type polycrystalline silicon must connect with a p-type polycrystalline silicon in a diode-free fashion (i.e., short to one another). This is typically done with a metal deposited on both n/p-type of polycrystalline silicon connection said materials. Unfortunately, this connection allows holes and/or electrons to move from their respective starting points through the metal into the oppositely doped material; this cross diffusion is undesirable.

FIG. 1A is a cross-sectional view taken from the front of a semiconductor structure 100 and FIG. 1B is a cross-sectional view taken from the top of the semiconductor structure 100 according to the prior art. The semiconductor structure 100 includes a gate oxide layer 108 that overlies an n-channel active area 102, a field region 118, and a p-channel active area 120. The n-channel active area 102 includes a p-type well 122 containing highly doped n-type areas 104, as shown in FIG. 1B. These highly doped areas 104 form a drain region and a source region of an n-channel transistor. The highly doped n-type areas 104 are doped with donor impurities. The p-channel active area 120 includes an n-type well 124 containing highly doped p-type areas 104, as shown in FIG. 1B. The highly doped p-type areas 104 are doped with acceptor impurities, and these highly doped p-type areas 104 form a drain region and a source region of a p-channel transistor.

The n-channel active area 102 also includes an n-type polycrystalline silicon strip 110A forming a transistor gate for the n-channel transistor, and the p-channel active area 120 includes a p-type polycrystalline silicon strip 110B forming a transistor gate for the p-channel transistor. A gate cap 112, which is formed from a nonconductive material, overlies both the n-type polycrystalline silicon strip 110A and the p-type polycrystalline silicon strip 110B. A spacer 114 surrounds a portion of the semiconductor structure 100 as shown in FIG. 1B. Both the spacer 114 and the gate cap 112 electrically isolate and structurally support the transistor gates from other conductive layers (not shown) in the semiconductor structure 100

In complementary semiconductor structures, such as CMOS, dual-doped polycrystalline silicon is used to simultaneously form p-channel and n-channel devices. Particularly, an SRAM cell uses a single polycrystalline line to form a gate electrode for both the pull-up device and the pull-down device. This single polycrystalline line is dual-doped with both acceptor impurities and donor impurities shown as portions 110A, B in FIG. 1A.

The n-type polycrystalline silicon strip 110A abuts against the p-type polycrystalline silicon strip 110B. As explained hereinbefore, a diode may undesirably form from the contact of the n-type polycrystalline silicon strip 110A and the p-type polycrystalline silicon strip 110B.

To prevent diode formation, a conductive material 113 is deposited on top of the n-type polycrystalline silicon strip 110A and the p-type polycrystalline silicon strip 110B. This conductive material 113 shorts the two types of polycrystalline silicon strips 110A, B so they are at the same potential.

The problem with this approach is that placing the conductive material 113 on top increases the height of the semiconductor device. Another problem is that the conductive material 113 can create undesired cross-diffusion. Cross-diffusion occurs when impurities from one type of polycrystalline silicon diffuse up through the conductive material 113 and diffuse down to the other type of polycrystalline silicon. This movement of impurities undesirably transforms the designed semiconductor characteristic of the polycrystalline silicon. A further problem is that certain conductive materials may decompose during processing, which forms an undesired dielectric layer that may create parasitic effects.

Typical structures of conduction material 113 result in cross diffusion. This cross diffusion is proportional to the amount of surface area between the doped polycrystalline silicon and conductive material. Therefore, the less contact area between doped polycrystalline silicon and conductive layers the lower the cross diffusion.

Thus, what is needed are structures, devices, and methods for enhancing semiconductor devices to inhibit cross diffusion and enable solutions for gate electrode connections.

SUMMARY OF THE INVENTION

An illustrative aspect of the present invention includes a semiconductor structure. The semiconductor structure includes a dual-doped polycrystalline silicon layer, which comprises a p-type strip and an n-type strip. The p-type strip has a top, a bottom, two sides, and two ends. The n-type strip also has a top, a bottom, two sides, and two ends. One of the ends of the p-type strip abuts against one of the ends of the n-type strip. The semiconductor structure also includes an inhibitor strip that adjoins a portion of one of sides of the p-type strip and a portion of one of the sides of the n-type strip.

BRIEF DESCRIPTION OF THE DRAWINGS

FIG. 5 is a block diagram of a computer system according to one embodiment of the present invention.

DETAILED DESCRIPTION OF THE INVENTION

Figure 1A:
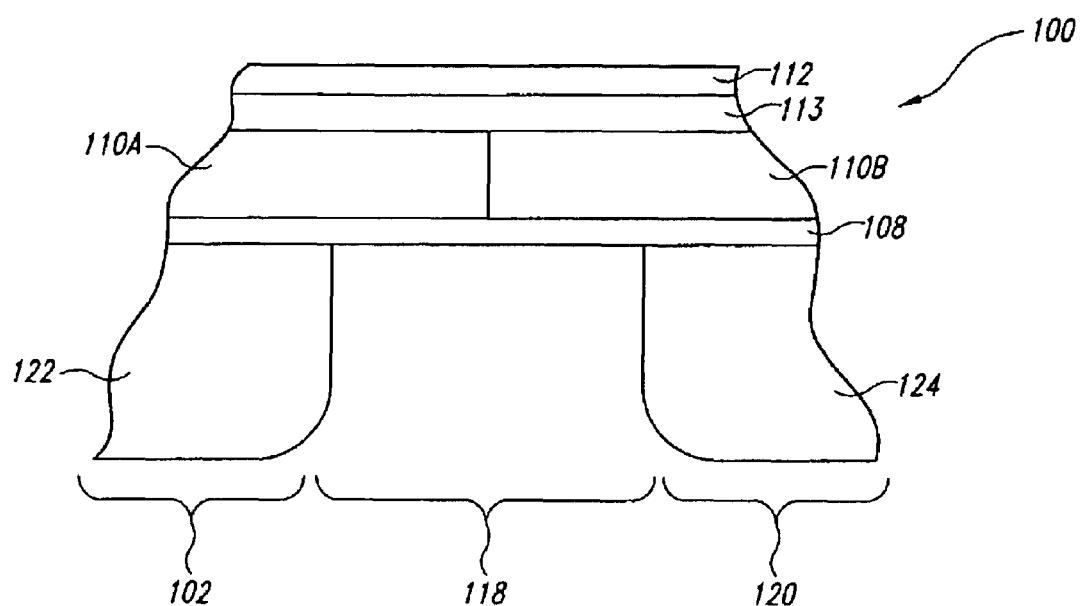
FIGS. 1A–1B are cross sectional views of a semiconductor structure according to the prior art.

In the following detailed description of various embodiments of the invention, reference is made to the accompanying drawings, which form a part hereof, and in which are shown, by way of illustration, specific exemplary embodiments in which the invention may be practiced. In the drawings, like numerals describe substantially similar components throughout the several views. These embodiments are described in sufficient detail to enable those skilled in the art to practice the invention. Other embodiments may be utilized and structural, logical, electrical, and other changes may be made without departing from the spirit or scope of the present invention. The following detailed description is, therefore, not to be taken in a limiting sense, and the scope of the present invention is defined only by the appended claims.

Figure 1B:
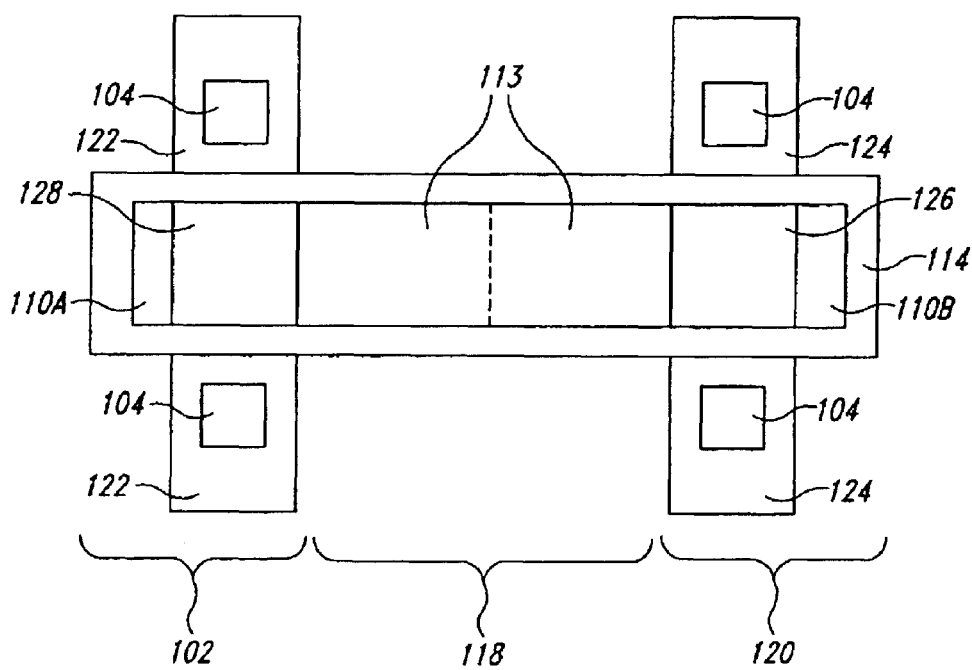
Figure 2A:
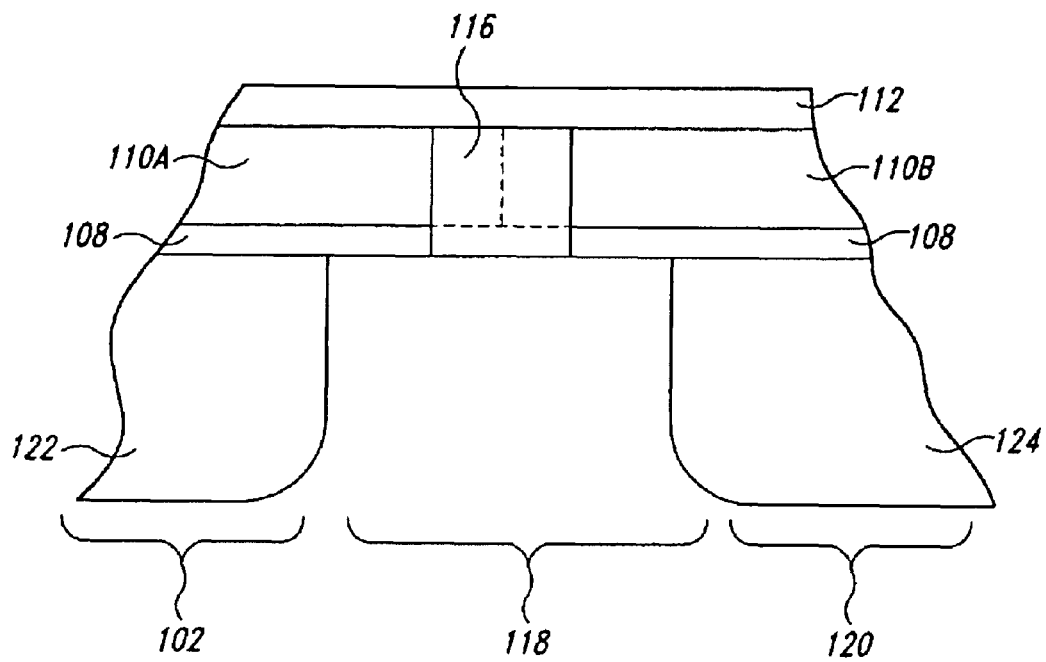
FIGS. 2A–2D are cross-sectional views of a semiconductor structure according to various embodiments of the present invention.
Figure 2B:
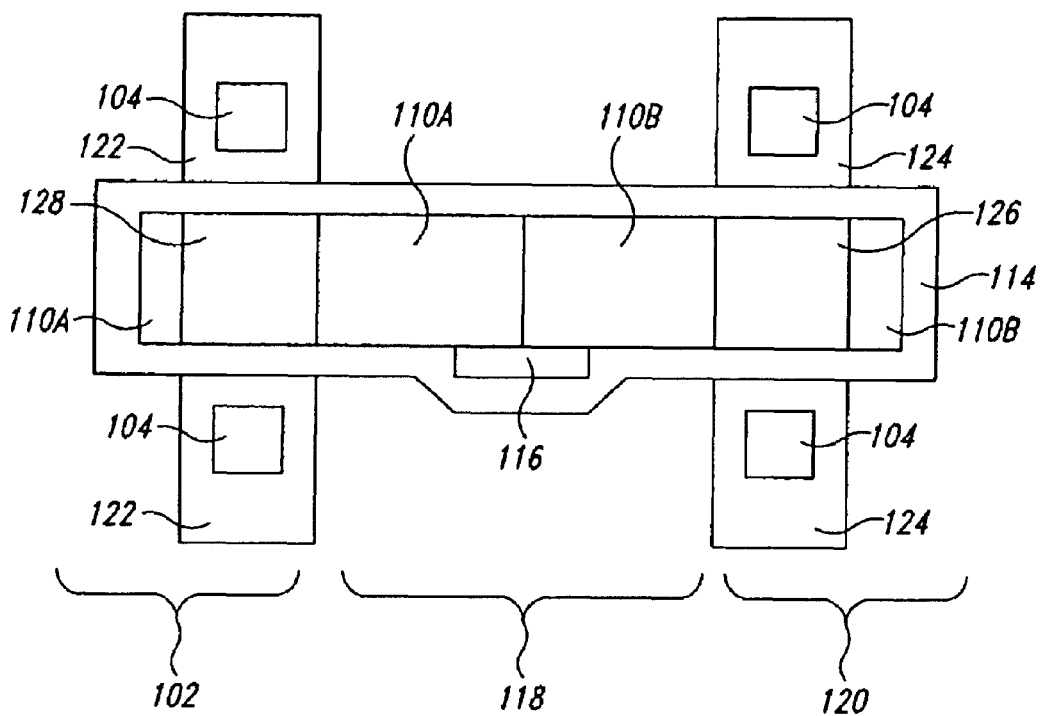

FIG. 2A is a cross-sectional view taken from the front of the semiconductor structure 100 and FIG. 2B is a cross-sectional view taken from the top of the semiconductor structure 100 according to one embodiment of the present invention. Several elements shown in FIGS. 2A–2B are similar to elements shown in FIGS. 1A–1B, and for brevity purposes, the discussion of those elements in FIGS. 1A–1B will not be discussed here again in full so as to focus on the embodiments of the present invention.

Recall the discussion hereinbefore regarding the problems associated with placing the conductive material 113 on top of the two types of polycrystalline silicon strips 110A, B. The embodiments of the present invention overcome one or more of these problems by providing an inhibitor strip 116 connecting the polycrystalline silicon strips 110A, B at one side of the polycrystalline silicon strips 110A, B as best shown in FIGS. 2A and 2B. Like the solution discussed in the prior art, the inhibitor strip 116 places both polycrystalline silicon strips 110A, B at the same potential so that the electric field in the depletion region cannot be overcome. Unlike the solution discussed above, the sidewall placement of the inhibitor strip 116 does not increase the height of the semiconductor device. Another advantage may include inhibition of cross-diffusion because the inhibitor strip 116 can be made physically shorter when it is placed on one or both sides of the polycrystalline silicon strips 110A, B. In this embodiment, the inhibitor strip 116 comprises a layer of tungsten on a layer of tungsten nitride. In still another embodiment, the inhibitor strip 116 is formed from a compound $WSi_x$, wherein x defines the number of desired atoms.

Figure 2C:
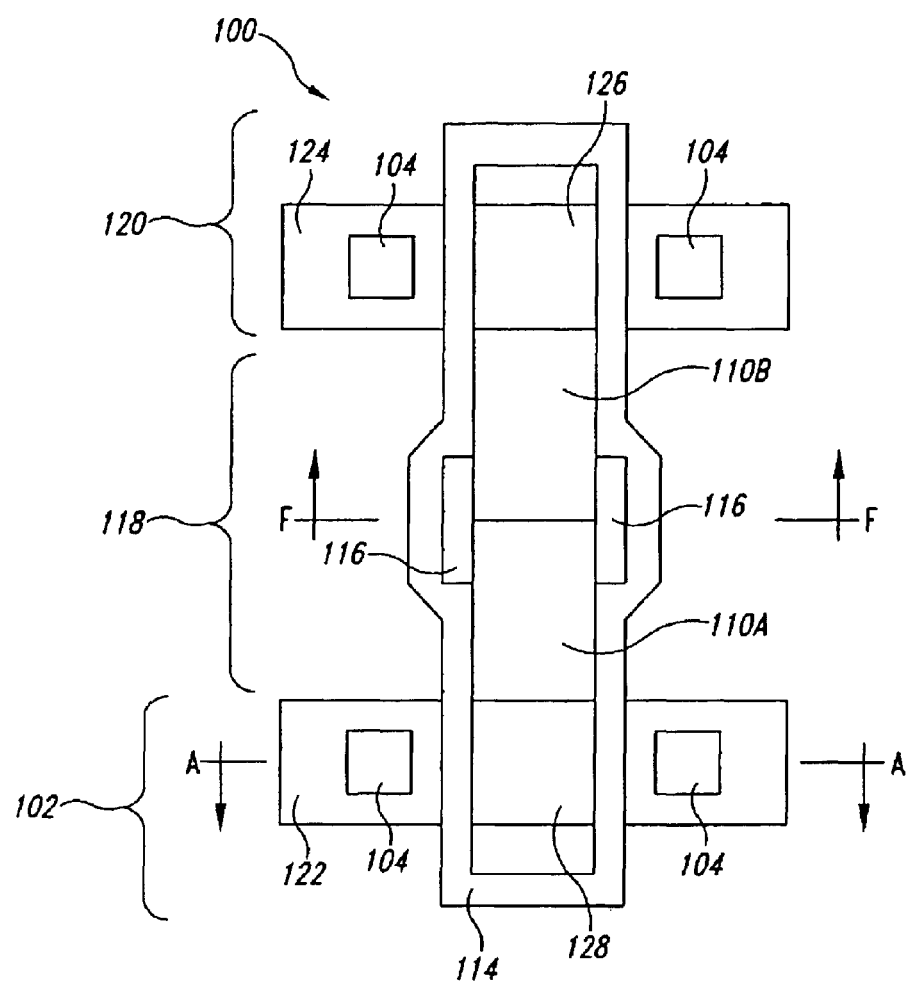

FIG. 2C is a cross-sectional view taken from the top of the semiconductor structure 100 according to one embodiment of the present invention. In this embodiment, two inhibitor strips 116 are adjoined to both sides of a portion of the p-type polycrystalline silicon strip 110B and a portion of the n-type polycrystalline silicon strip 110A.

Figure 2D:
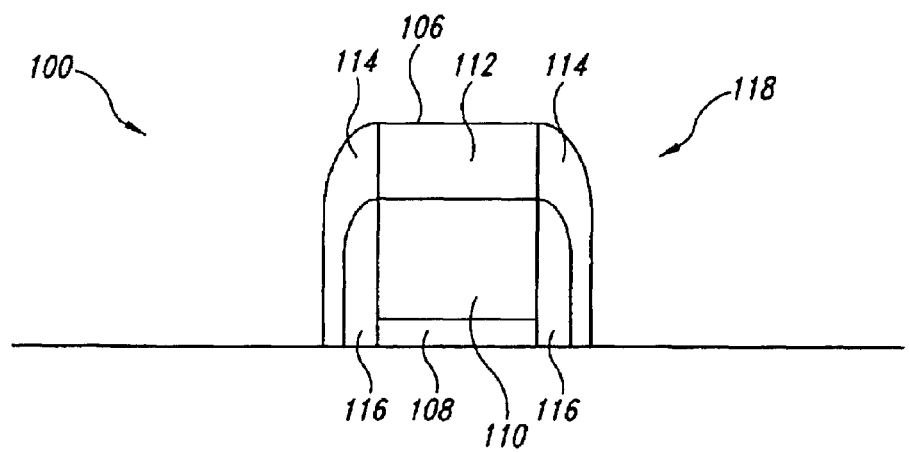

FIG. 2D is a cross-sectional view of the semiconductor structure taken along the line F–F' of FIG. 2C. Note that the cross-sectional view shows the optional gate gap 112, which was not shown in FIG. 2C. The gate structure 106 shows that the inhibitor strip 116 is adjoined sideways with respect to the polycrystalline silicon strips 110A, B. The inhibitor strip 116 can be likened to a strap that is affixed to the sidewall of polycrystalline silicon strips 110A, B. In this way, the strap formed by the strips 116 can be likened to a sidewall that straps the polycrystalline silicon strips 110. In one embodiment the inhibitor layer 116 includes a material chosen from a refractory metal, a combination of metal ions and silicon ions, or a metal nitride.

Figure 3:
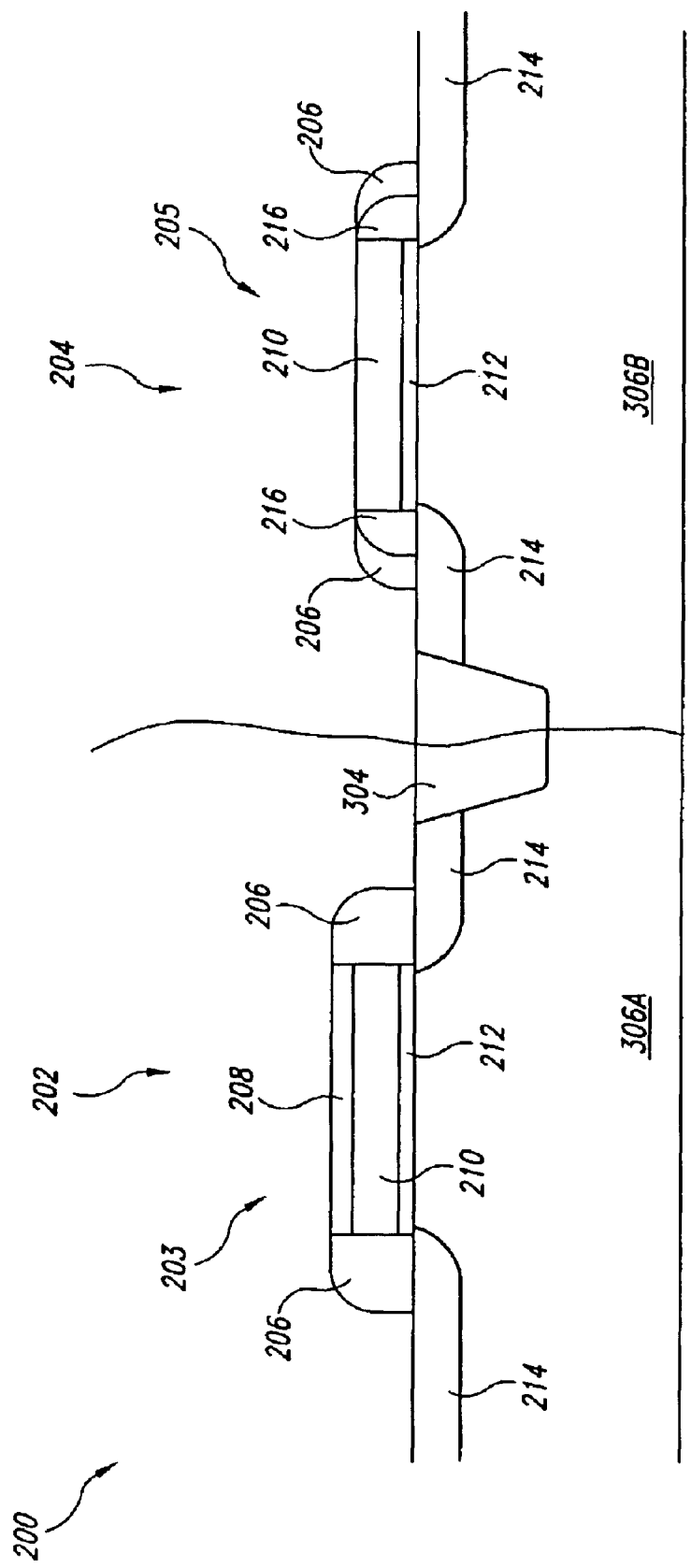
FIG. 3 is a cross-sectional view of a semiconductor structure showing a logic portion of a memory device and an array portion of the memory device according to one embodiment of the present invention.

FIG. 3 is a cross-sectional view of a semiconductor structure showing a portion of a memory device 200 with an inhibitor strip 216 according to one embodiment of the present invention. The inhibitor strip 216 is the same as the inhibitor strip 116 as described hereinabove. The memory device 200 includes a logic area 202 and an array area 204 that are isolated by an isolation region 304 formed between these two areas. The logic area 202 includes various devices to control access to the array area 204. These devices include address decoders, row access circuitry, column access circuitry, control circuitry, and input/output circuitry. None of these circuits is shown so as to help focus on the embodiments of the present invention.

The logic area 202 includes at least one transistor 203 formed in an n-well 306A. The transistor 203 includes highly doped areas 214 that act as a drain and a source. The transistor 203 includes a gate 210, which is separated from the highly doped areas 214 by a gate oxide 212. The gate 210 may be formed from dual-doped polycrystalline silicon. To inhibit one or more of the problems discussed hereinabove, a top strap 208 is used. However, if desired, the top strap 208 need not be used and instead can be substituted by a sidewall strap as discussed hereinabove and hereinbelow. The formation of the top strap 208 does not limit the embodiments of the present invention, and will not be discussed here in full.

The array area 204 includes at least one cell 205, which is comprised of the highly doped areas 214 formed in a p-well 306B, a gate oxide 212, a gate 210, and spacers 206. The gate 210 may be formed from dual-doped polycrystalline silicon. To inhibit one or more of the problems as discussed hereinabove, an inhibitor strip 216 is used. The inhibitor strip 216 allows the height of the cell 205 to be controlled, which helps to provide greater process latitude at submicron levels. The highly doped areas 214 function as source and drain regions of a corresponding transistor in the cell 205.

In one embodiment, the top strap 208 is composed of a material selected from a group that includes a combination of titanium and silicon and tungsten silicide $WSi_x$ and tungsten/tungsten nitride $W/WN_x$, a combination of cobalt and silicon, various species of refractory metal silicide, and various species of refractory metal nitride. The inhibitor strip 216 is a material selected from a group that includes a combination of tungsten and tungsten nitride, a compound of tungsten ions and silicon ions, a compound of titanium ions and silicon ions, and a compound of cobalt ions and silicon ions. In one embodiment, both the top strap 208 and the inhibitor strip 216 maybe comprised of the same material.

Figure 4A:
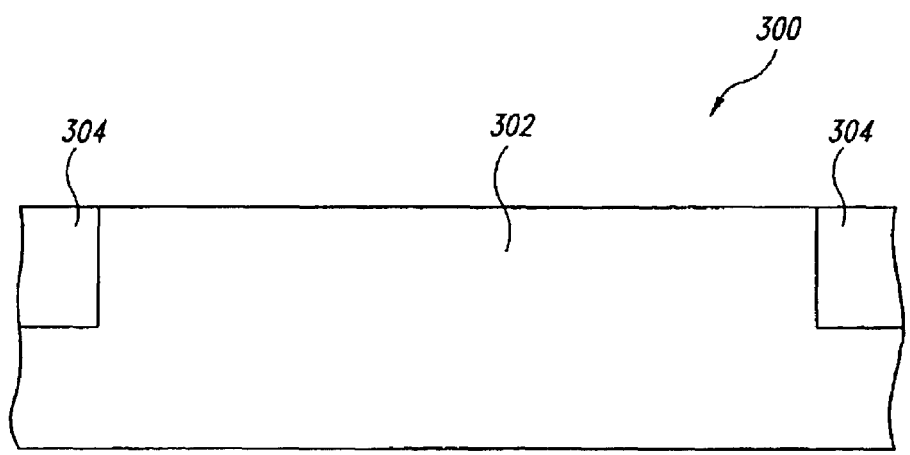
FIGS. 4A–4O are cross-sectional views of a semiconductor structure during processing according to one embodiment of the present invention.
Figure 4B:
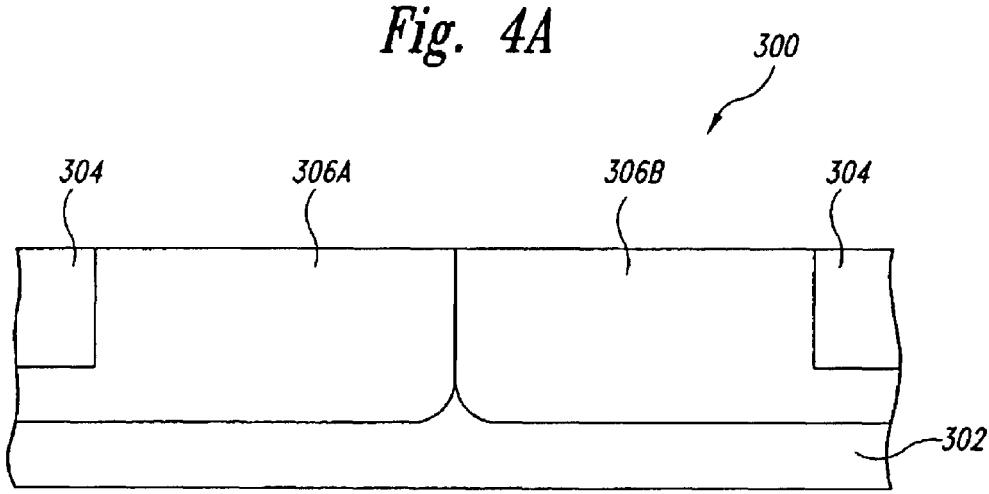
Figure 4C:
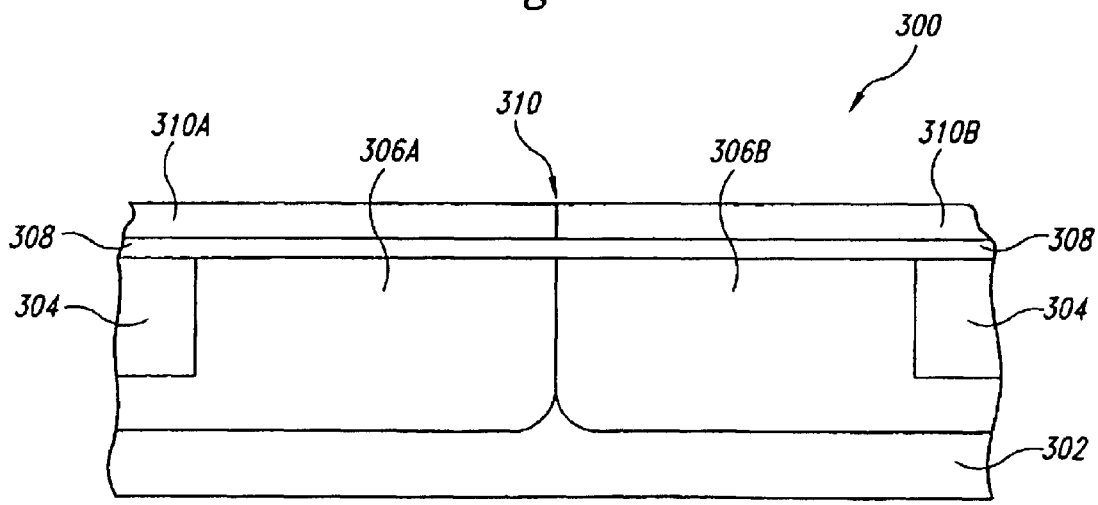
Figure 4D:
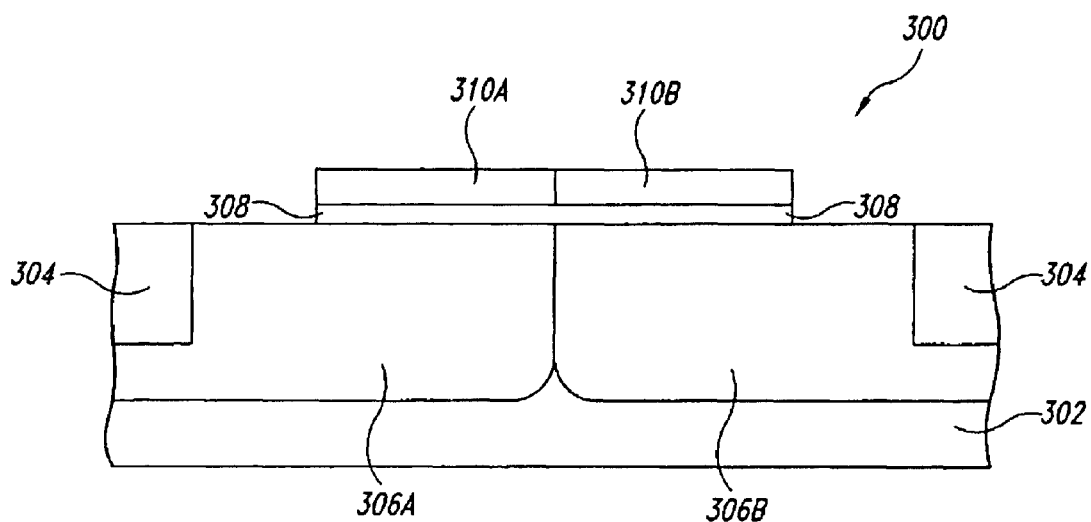
Figure 4E:
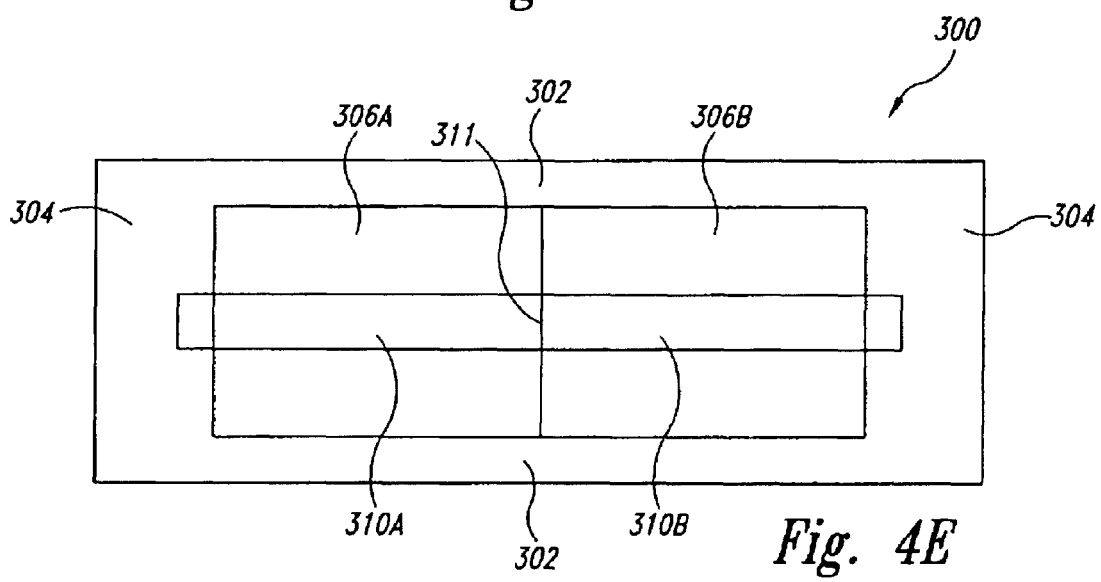
Figure 4F:
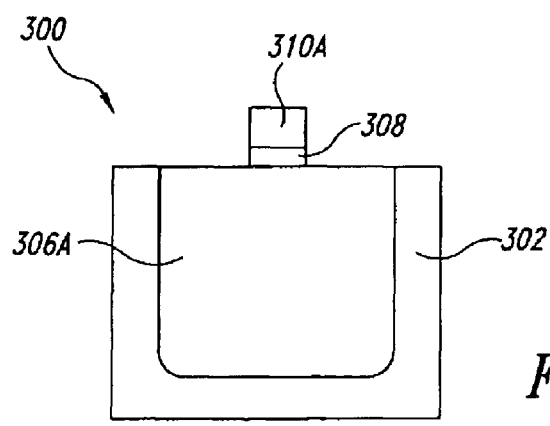
Figure 4G:
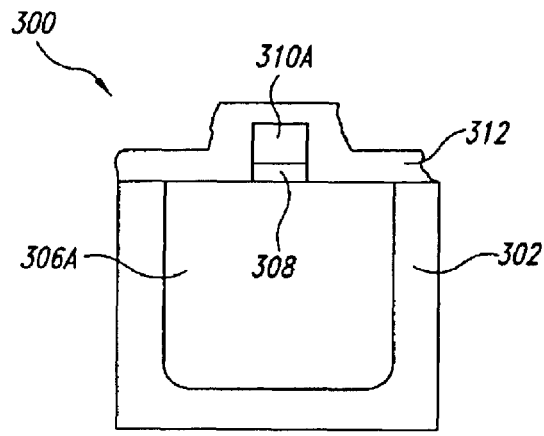
Figure 4H:
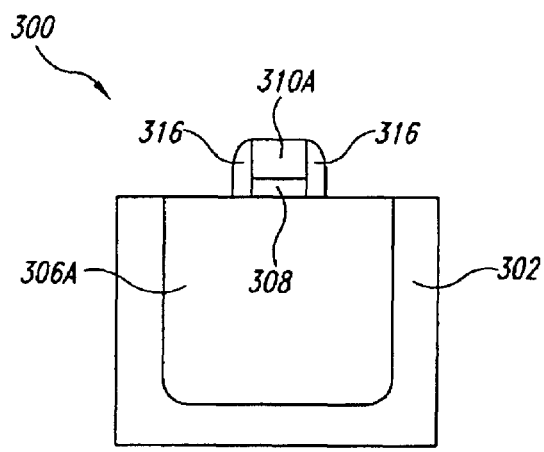
Figure 4I:
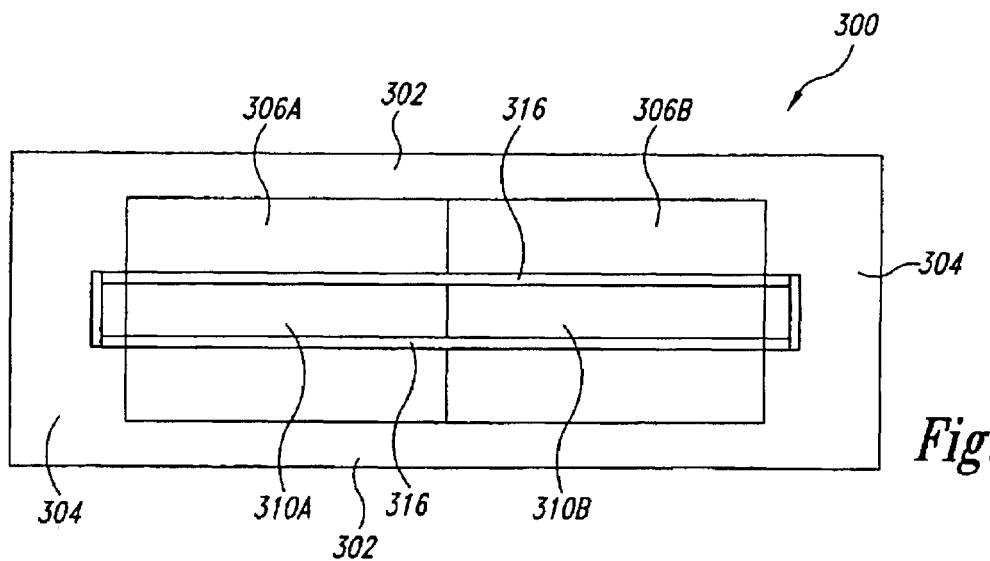
Figure 4J:
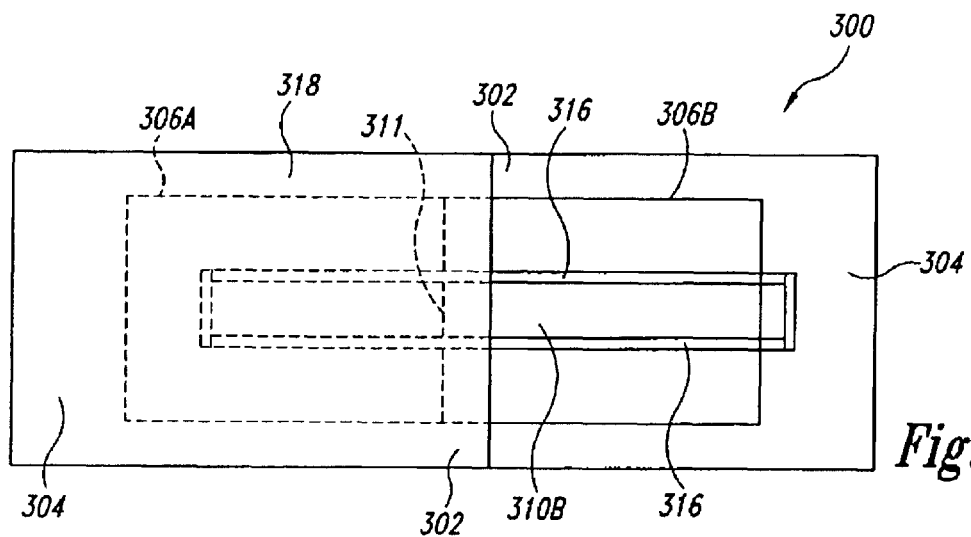
Figure 4K:
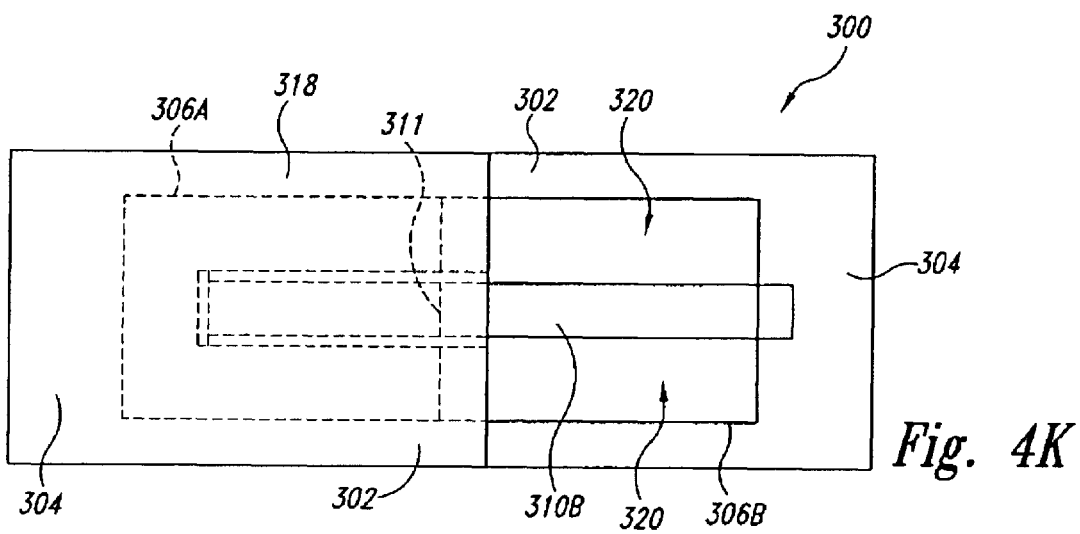
Figure 4L:
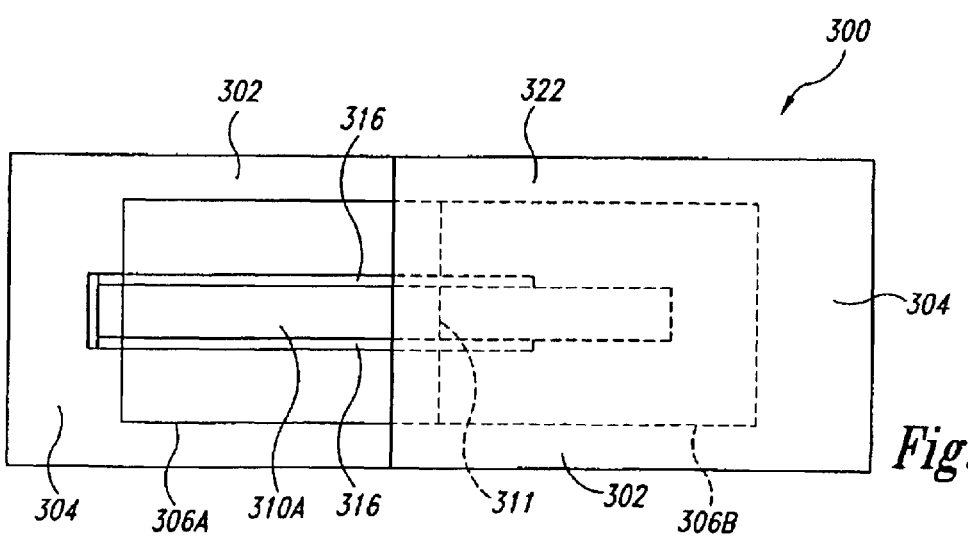
Figure 4M:
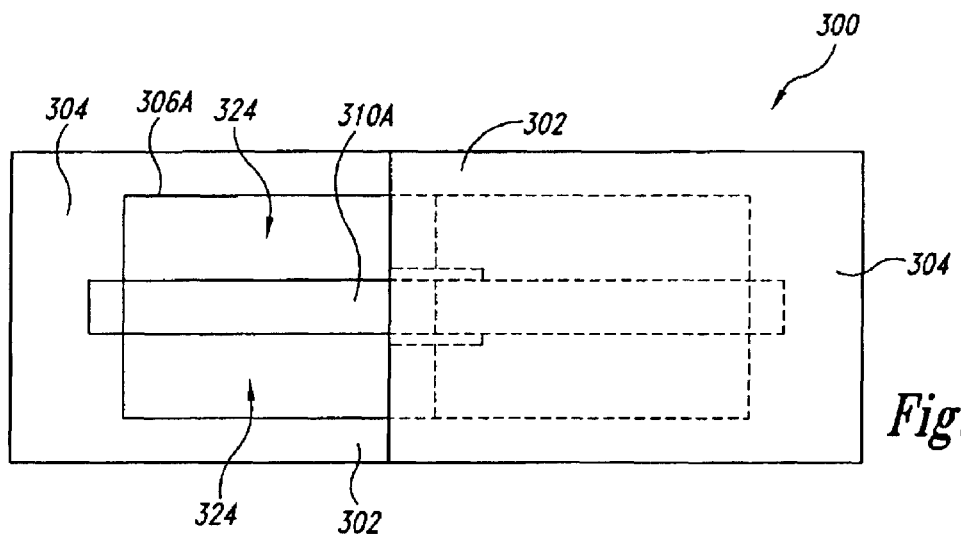
Figure 4N:
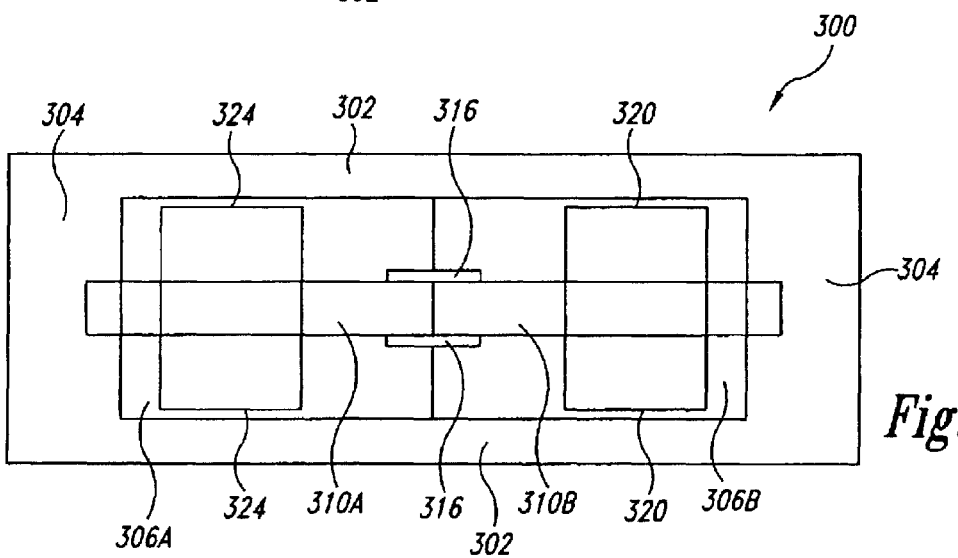
Figure 4O:
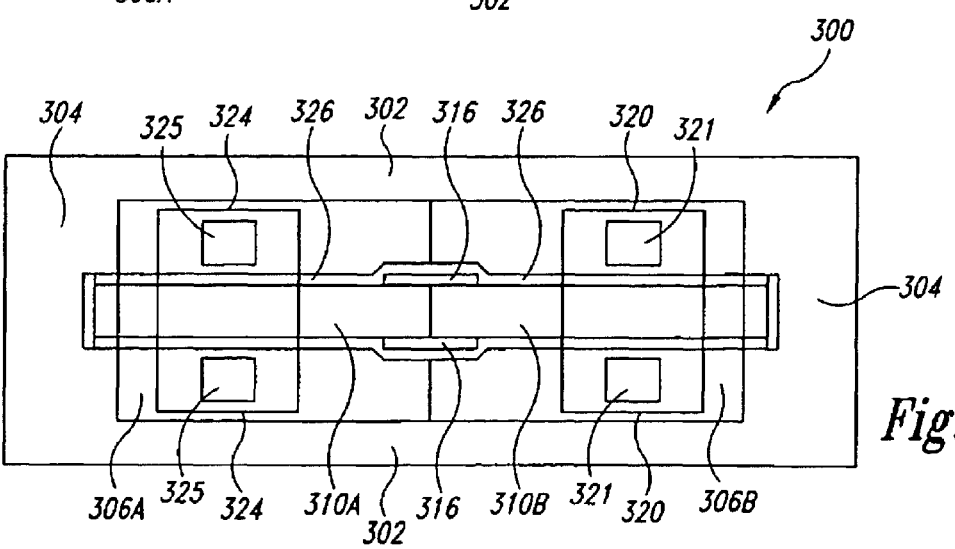

FIGS. 4A–4O are cross-sectional views of a semiconductor structure 300 during processing according to one embodiment of the present invention. The discussion in FIGS. 4A–4O illustrates a few of the steps associated with a fabrication process. The entire fabrication process is not discussed so as to focus on the embodiments of the present invention. Other methods of fabrication are also feasible and perhaps equally viable. For clarity purposes, many of the reference numbers, once discussed, may be eliminated from subsequent drawings so as to provide greater emphasis on the portion of interest of the semiconductor structure 300.

FIG. 4A is a cross-sectional view taken from the front of the semiconductor structure 300. The semiconductor structure 300 includes a substrate 302 that can be of any suitable substances and compounds that support a complementary semiconductor structure. Examples of suitable substances and compounds include lightly doped n-type or p-type material and a lightly doped epitaxial layer on a heavily doped substrate. The semiconductor structure 300 undergoes an isolation process, which can be of any technique that isolates like devices within the same well or isolates n-channel devices from p-channel devices and prevents latchup in a complementary semiconductor structure. One suitable technique, which is known as shallow trench isolation (STI), forms at least one shallow trench 304. This technique does not limit the embodiments of the present invention, however, and others may be used instead.

FIG. 4B is a cross-sectional view taken from the front of the semiconductor structure 300 following the next sequence of processing. The semiconductor structure 300 undergoes a process to form wells for a complementary semiconductor structure. One suitable technique includes a twin-well process. This technique produces two separate wells, which are illustrated as a p-well 306B and an n-well 306A. Each of these wells is formed for n-channel and p-channel transistors. Each set of the n-channel and p-channel transistors forms the complementary semiconductor structure that is used in certain semiconductor devices, such as CMOS.

FIG. 4C is a cross-sectional view taken from the front of the semiconductor structure 300 following the next sequence of processing. A layer of silicon dioxide 308 is deposited over the semiconductor structure 300 to later form a gate oxide. A polycrystalline silicon layer 310 is deposited over the layer of silicon dioxide 308. The polycrystalline silicon layer 310 undergoes a dual-doped process so as to form a p-type polycrystalline silicon layer 310A and an n-type polycrystalline silicon layer 310B. The dual-doped process uses a suitable implantation technique to insert acceptor impurities into the polycrystalline silicon layer 310A and donor impurities into the polycrystalline silicon layer 310B.

A layer of non-conductive material can be deposited over the dual-doped polycrystalline to later form a gate cap. The non-conductive material may be selected from a group consisting of oxides and nitrides. The gate cap may add structural support and electrical isolation. Because the forming of the gate cap is optional, this step is not shown in the drawings.

FIG. 4D is a cross-sectional view taken from the front of the semiconductor structure 300 following the next sequence of processing. The semiconductor structure 300 undergoes a gate patterning process with an appropriate mask to define the gate for the transistors formed in the n-well 306A and the p-well 306B. The semiconductor structure 300 then undergoes an etching process to remove a portion of the silicon dioxide 308 and a portion of the dual-doped polycrystalline silicon layer 310A–310B. One suitable etching process includes a dry etching process, such as plasma etching, ion milling, or reaction ion etching.

FIG. 4E is a cross-sectional view taken from the top of the semiconductor structure 300 following the sequence of processing as discussed in FIG. 4D. The width of the dual-doped polycrystalline silicon layer 310A–310B has been reduced through the patterning and etching process to a strip or a line situated longitudinally across the n-well 306A and the p-well 306B. Because the portion of the p-type polycrystalline silicon layer 310A adjoins or abuts the n-type polycrystalline silicon layer 310B at a junction 311, a diode maybe undesirably formed by this junction. The embodiments of the invention inhibit such a diode from being formed or being active.

FIG. 4F is a cross-sectional view taken from a side of the semiconductor structure 300 following the sequence of processing as discussed in FIG. 4D. Thus, FIGS. 4D, 4E, and 4F show different aspects of the semiconductor structure 300 after the dual-doped polycrystalline silicon layer 310A–310B has been patterned and etched to form the gate structure. This cross-sectional view is taken from the n-well 306A. As shown, the n-well 306A is housed in a substrate 302. A gate structure has been formed from the p-type polycrystalline silicon layer 310A. The gate oxide 308 separates this gate structure from the n-well 306A. This cross-sectional side view is presented here so as to focus more clearly on the embodiments of the present invention in the next few drawings.

FIG. 4G is a cross-sectional view taken from the side of the semiconductor structure 300 following the next sequence of processing. A conductive substance or compound 312 is deposited over the semiconductor structure 300. Any suitable deposition techniques may be used, such as high-vacuum evaporation, sputtering, and chemical vapor deposition. The conductive substance or compound 312 may be selected from a group including a material selected from a layer of tungsten over a layer of tungsten nitride, a compound of tungsten ions and silicon ions, a compound of titanium ions and silicon ions, a compound of cobalt ions and silicon ions, a refractory metal, a combination of metal ions and silicon ions, a metal nitride, tungsten silicide, and tungsten nitride.

FIG. 4H is a cross-sectional view taken from the side of the semiconductor structure 300 following the next sequence of processing. The conductive substance or compound 312 is etched to form the inhibitor layer 316 on the sides of the gate structure formed by the p-type polycrystalline silicon layer 310A and gate oxide 308. The etching process should provide directional etching such that vertical etching proceeds at a faster rate than the horizontal etching. Any suitable etching processes may be used, such as an anisotropic technique provided by plasma etching. In one embodiment, the inhibitor layer 316 is formed such that it appears on only one side of the gate structure. In another embodiment, the inhibitor 316 is formed on both sides of the gate structure.

FIG. 4I is a cross-sectional view taken from the top of the semiconductor structure 300 following the sequence of processing as discussed in FIG. 4H. The inhibitor layer 316 adjoins the dual-doped polycrystalline silicon layer 310A–310B. The inhibitor layer 316 inhibits one or more of the problems as discussed hereinbefore. This cross-sectional view is presented here so as to focus more clearly on the embodiments of the present invention in the next few drawings.

FIG. 4J is a cross-sectional view taken from the top of the semiconductor structure 300 following the next sequence of processing. A mask 318 is placed over the semiconductor structure 300. The portion of the semiconductor structure 300 that is protected by the mask 318 is presented in an outline form (i.e., dotted lines), and the portion of the semiconductor structure 300 that is exposed by the mask 318 is presented in a solid form. Note that the mask 318 protects a portion of the semiconductor structure 300 beyond the junction 311 of the dual-doped polycrystalline silicon layer 310A–310B. The mask 318, which is conventionally used for forming complementary semiconductor structures, may be formed from a combination of a double-diffused mask and a light-doped drain mask.

FIG. 4K is a cross-sectional view taken from the top of the semiconductor structure 300 following the next sequence of processing. The semiconductor structure 300 undergoes an etching process to remove the inhibitor layer 316 from the portion of the semiconductor structure 300 exposed by the mask 318. One suitable etching technique includes a wet etching technique, such as immersion or spray. This masking and etching process shortens the inhibitor layer 316 to a desired length so the inhibitor layer 316 can help to inhibit cross-diffusion yet still provide electrical connection between both n-type and p-type polycrystalline silicon.

After this etching process, the semiconductor structure 300 is implanted with donor impurities in the areas 320 in the p-well 306B to form the drain and the source regions for an n-channel transistor. A suitable impurity substance is selected from a group consisting of phosphorus and arsenic. After the implantation process, the mask 318 is removed by a suitable etching process to prepare the semiconductor structure 300 for the next sequence of processing.

FIG. 4L is a cross-sectional view taken from the top of the semiconductor structure 300 following the next sequence of processing. A mask 322 is being placed over the semiconductor structure 300. The portion of the semiconductor structure 300 that is protected by the mask 322 is presented in an outline form. The portion of the semiconductor structure 300 that is exposed by the mask 322 is presented in a solid form. Note that the mask 322 protects a portion of the semiconductor structure 300 beyond the junction 311 of the dual-doped polycrystalline silicon layer 310A–310B. The mask 322, which is conventionally used for forming complementary semiconductor structures, may be formed from a combination of a halo lightly-doped drain mask and a boron fluoride lightly-doped drain mask.

FIG. 4M is a cross-sectional view taken from the top of the semiconductor structure 300 following the next sequence of processing. The semiconductor structure 300 undergoes an etching process to remove the inhibitor layer 316 from the portion of the semiconductor structure 300 exposed by the mask 322. One suitable etching technique includes a wet etching technique, such as immersion or spray. This etching process further shortens the inhibitor layer 316 to the desired length so the inhibitor layer 316 can help to inhibit cross-diffusion, and yet still provide electrical connection between both n-type and p-type polycrystalline silicon.

Next, the semiconductor structure 300 is implanted with acceptor impurities in the areas 324 in the n-well 306A to form the drain and the source for a p-channel transistor. A suitable impurity substance includes boron. After the implantation process, the mask 322 is removed by a suitable etching process to prepare the semiconductor structure 300 for the next sequence of processing.

FIG. 4N is a cross-sectional view taken from the top of the semiconductor structure 300 following the sequence of processing as discussed in FIGS. 4J–4M. The areas 324 in the n-well 306A and areas 320 in the p-well 306B define respective active regions in the wells, which are illustrated as the regions 324 and 320, respectively, in FIG. 4N. The semiconductor structure 300 shows the remaining portions of the inhibitor layer 316. The application of the mask 318 and the mask 322 defines the desired width of the inhibitor layer 316. The benefit of the approach as discussed in FIGS. 4J–4M is the reuse of masks that are already being used for the implantation of impurities to form the drains and the sources in complementary semiconductor structures. Another benefit is that the width of the inhibitor layer 316 can be controlled by changing the positions of the mask 318 and the mask 322.

What has been discussed hereinbefore can be described as a maskless approach in forming the inhibitor layer 316 because a processing engineer need not design a mask to define the width of the inhibitor layer 316. Another approach is to design one mask that defines a fixed width for the inhibitor layer 316 and exposes the portions of the semiconductor structure 300 to be doped with impurities to form the drains and sources. The benefit of this approach is a simplification of the process to produce the inhibitor layer 316.

FIG. 4O is a cross-sectional view taken from the top of the semiconductor structure 300 following the next sequence of processing. A pair of contacts 321 is formed over source and drain regions in the active region 320 in the p-well 306B, and a pair of contacts 325 is formed over source and drain regions in the active region 324 in the n-well 306A. A non-conductive material is deposited over the semiconductor structure 300. A suitable non-conductive material includes silicon dioxide that is doped with phosphorus and boron. The non-conductive material is then anisotropically etched to form the spacer 326. Other steps to complete the processing of the semiconductor structure 300, such as for a CMOS structure, may follow the processing as discussed hereinbefore. But such steps do not limit the embodiments of the invention and will not be presented here in full.

FIG. 5 is a block diagram of a computer system according to one embodiment of the present invention. Computer system 1000 contains a processor 1110 and a memory system 1102 housed in a computer unit 1105. Computer system 1100 is but one example of an electronic system containing another electronic system, e.g., memory system 1102, as a subcomponent. The memory system 1102 may include a complementary semiconductor structure that includes an inhibiting layer as discussed in various embodiments of the present invention. Computer system 1100 optionally contains user interface components, such as a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit.

Devices, structures, and methods have been discussed to address situations where dual-doped polycrystalline silicon undesirably acts to form a diode or exhibit cross diffusion when connected. The embodiments of the present invention provide an inhibitor layer to inhibit such a diode from being formed or being active. The inhibitor layer is situated on the sidewall with respect to the dual-doped polycrystalline silicon so as to reduce the stack height of a gate structure. This lowers the profile and aids in planarization. As discussed hereinbefore, a technique is provided to define the inhibitor layer without forming a mask although a mask option is also discussed. In certain embodiments, the position of the inhibitor layer lowers the cross-diffusion. In other embodiments, any conductive materials may be used for the inhibitor layer without regard for series capacitance and resistance. In yet other embodiments, periphery circuits, such as logic circuits, may continue to use a low resistance top strap, made of various silicides, without affecting the process of providing the inhibitor layer as a sideways strap.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

We claim:

1. A method for forming a semiconductor structure, comprising:
    forming at least one well from a semiconductor substance in a substrate;
    forming a gate structure over at least a portion of the well from dual-doped polycrystalline silicon, the gate structure having a boundary between the dual doping;
    forming at least one sideways strap that is strapped to a portion of the dual-doped polycrystalline silicon across the boundary and electrically isolated from the well, the sideways strap overlaying a region of the substrate; and
    forming active regions in the well and adjacent the gate structure, the active regions disposed from the sideways strap and the region the sideways strap overlays.

2. The method of claim 1, further comprising forming an isolation area by forming at least one shallow trench, wherein the act of forming the isolation area occurs before the act of forming at least one well.

3. The method of claim 1, further comprising forming gate cap from a substance selected from a group consisting of silicon dioxide and silicon nitride.

4. The method of claim 1, wherein forming a gate structure includes depositing polycrystalline silicon and implanting impurities into the polycrystalline silicon.

5. The method of claim 4, wherein forming a gate structure includes dry etching the polycrystalline silicon and cleaning the result of the act of dry etching so as to form the gate structure.

6. The method of claim 1, wherein forming at least one sideways strap includes depositing a conductive substance, wherein the conductive substance is selected from a group consisting of tungsten-tungsten nitride, tungsten silicide, titanium silicide, cobalt silicide, refractory materials, metal silicide, and refractory metal nitride.

7. The method of claim 6, wherein forming at least one sideways strap includes etching the conductive substance directionally where the etch rate in a first direction is greater than the etch rate in a second direction perpendicular to the first direction to form the at least one sideways strap.

8. The method of claim 7, wherein forming at least one sideways strap includes applying at least one of two masks, wherein each mask of the two masks is selected from a group consisting of a double-diffused drain mask and a lightly-doped drain mask used for the formation of drain regions adjacent the gate structure.

9. The method of claim 8, further comprising implanting donor impurities.

10. The method of claim 7, wherein forming at least one sideways strap includes applying at least one of two masks, wherein each mask of the two masks is selected from a group consisting of a halo lightly-doped drain mask and a boron lightly-doped drain mask used for the formation of drain regions adjacent the gate structure.

11. The method of claim 10, further comprising implanting acceptor impurities.

12. The method of claim 1, wherein forming at least one sideways strap includes cleaning the semiconductor structure by a wet clean process so as to remove a conductive substance of the at least one sideways strap from undesired areas.

13. The method of claim 1, wherein forming at least one sideways strap includes depositing selectively gate gap over the polycrystalline silicon.

14. The method of claim 1, further comprising forming dielectric spacer over at least a portion of the gate structure and the sideways strap.

15. The method of claim 1, wherein forming at least one sideways strap includes applying a mask that allows a conductive substance of the at least one sideways strap to be removed from undesired areas.

16. A method for forming a semiconductor structure, comprising:
    forming at least two active areas in a semiconductor substrate;
    forming a field positioned between the at least two active areas and defining a field region on the semiconductor substrate;
    forming a dual-doped polycrystalline silicon gate structure overlying the active areas and the field; and
    forming at least one sideways strap that is strapped to a sidewall surface of the dual-doped polycrystalline silicon gate structure over the field and within the field region, the sideways strap electrically isolated from the active areas.

17. The method of claim 16, wherein forming the at least two active areas comprises defining an active area for the conduction of holes in a p-channel, and further defining an active area for conduction of electrons in an n-channel.

18. The method of claim 17 wherein forming the dual-doped polycrystalline silicon gate structure comprises forming a dual-doped polycrystalline silicon gate structure having a p-type portion and an n-type portion, wherein the p-type portion adjoins the n-type portion in the field.

19. The method of claim 18, wherein forming the at least one sideways strap comprises forming the sideways strap strapped to a portion of the dual-doped polycrystalline silicon gate structure where the p-type portion adjoins the n-type portion.

20. The method of claim 19, further comprising forming a dielectric spacer that adjoins the dual-dope polycrystalline silicon gate structure and the at least one sideways strap.

21. A method for forming a semiconductor structure, comprising:

forming in a substrate a p-type well having an active area for the conduction of electrons;

forming in the substrate an n-type well having an active area for the conduction of holes;

forming a dual-doped polycrystalline silicon strip that is situated over the active areas of the p-type and n-type wells, the dual-doped polycrystalline silicon strip having a p-type portion doped by acceptor impurities and an n-type portion doped by donor impurities adjoining the p-type portion; and forming an inhibitor strip electrically isolated from the active areas of the p-type and n-type wells that adjoins on at least one side of the dual-doped polycrystalline silicon strip to contact both the p-type portion of the dual-doped polycrystalline silicon strip and the n-type portion of the dual-doped polycrystalline silicon strip, the inhibitor strip positioned along the dual-doped polycrystalline silicon strip between the active areas of the p-type and n-type wells.

22. The method of claim 21, further comprising forming a non-active area between the actives areas, wherein the non-active area defines a field area.

23. The method of claim 21 wherein forming the inhibitor strip comprises forming an inhibitor strip positioned in the non-active area.

* * * * *